US012622022B2

(12) United States Patent
Chen

(10) Patent No.: US 12,622,022 B2
(45) Date of Patent: May 5, 2026

(54) SEMICONDUCTOR DEVICE AND METHOD OF MANUFACTURING THEREOF

(71) Applicant: NANYA TECHNOLOGY CORPORATION, New Taipei city (TW)

(72) Inventor: Wei Yu Chen, Miaoli County (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 427 days.

(21) Appl. No.: 18/198,497

(22) Filed: May 17, 2023

(65) Prior Publication Data

US 2024/0387621 A1     Nov. 21, 2024

(51) Int. Cl.
H10D 62/10        (2025.01)
H01L 21/764        (2006.01)

(52) U.S. Cl.
CPC ......... H10D 62/115 (2025.01); H01L 21/764 (2013.01)

(58) Field of Classification Search
CPC .. H10D 62/115; H10D 64/021; H10D 64/258; H10D 64/015; H10D 64/01; H10D 64/251; H10D 64/017; H10D 64/679; H10D 30/60; H10D 30/62; H10D 30/024; H10D 30/6219; H01L 21/764; H01L 21/7682; H01L 21/76897; H01L 21/28123; H01L 23/485; H01L 21/0228; H01L 21/67259; H01L 21/67069; H01L 21/31122; H01L 21/02175; H01L 21/768; H01L 21/02274; H10B 12/0335; H10B 12/482; H10B 12/34; H10B 12/315; H10B 12/485

See application file for complete search history.

(56) References Cited

U.S. PATENT DOCUMENTS

| | | | | |
|---|---|---|---|---|
| 10,825,722 B1 * | 11/2020 | Kuan | ................ | H01L 21/31053 |
| 11,239,111 B1 * | 2/2022 | Huang | ............. | H01L 21/76831 |
| 11,469,235 B2 * | 10/2022 | Huang | ................ | H10B 12/485 |
| 2013/0115769 A1 * | 5/2013 | Yu | ..................... | H01L 21/76898 |
| | | | | 257/E21.597 |
| 2016/0163816 A1 * | 6/2016 | Yu | ........................ | H10D 64/021 |
| | | | | 438/283 |
| 2017/0062347 A1 * | 3/2017 | Kim | ................... | H01L 23/4821 |
| 2018/0233398 A1 * | 8/2018 | Van Cleemput | .... | H01L 21/7682 |

(Continued)

FOREIGN PATENT DOCUMENTS

TW          202240790          10/2022

*Primary Examiner* — Mouloucoulaye Inoussa
(74) *Attorney, Agent, or Firm* — CKC & Partners Co., LLC

(57) ABSTRACT

The present disclosure provides a method of manufacturing a semiconductor device. The method includes forming a first spacer on a bit line, wherein the first spacer includes low-k material doped with carbon. An oxidation process is performed to the first spacer such that a surface portion of the first spacer is transformed to an oxide spacer. The first spacer has a remaining first spacer that is not oxidized by the oxidation process. Then, a second spacer is formed on the oxide spacer, wherein the second spacer includes nitride. The oxide spacer is removed to form a gap between the remaining first spacer and the second spacer. A cover layer is formed to cover the bit line, the remaining first spacer, and the second spacer such that an air gap is sealed by the cover layer, the remaining first spacer, and the second spacer.

14 Claims, 15 Drawing Sheets

200

(56)             References Cited

U.S. PATENT DOCUMENTS

| | | | |
|---|---|---|---|
| 2020/0020567 A1* | 1/2020 | Sun | H01L 21/764 |
| 2020/0020697 A1* | 1/2020 | Kim | H10B 12/0335 |
| 2021/0202712 A1* | 7/2021 | Chen | H10D 64/021 |
| 2021/0366912 A1* | 11/2021 | Chung | H10B 12/482 |
| 2022/0059543 A1* | 2/2022 | Mun | H10B 12/34 |
| 2022/0254899 A1* | 8/2022 | Huang | H10D 64/251 |
| 2022/0271145 A1* | 8/2022 | Yang | H10D 64/021 |
| 2022/0375944 A1* | 11/2022 | Lin | H10D 62/151 |
| 2023/0009103 A1* | 1/2023 | Won | H10B 12/482 |
| 2023/0080850 A1* | 3/2023 | Kim | H10D 30/43 |
| | | | 257/288 |
| 2023/0238276 A1* | 7/2023 | Chuang | H10B 12/485 |
| | | | 257/296 |

* cited by examiner

100

100

132

132S

140

110T

110

120T

124

122

120

100

100

200

200

244
244S
252
210

200

200

SEMICONDUCTOR DEVICE AND METHOD OF MANUFACTURING THEREOF

BACKGROUND

Field of Invention

The present invention relates to semiconductor device and method of manufacturing thereof. More particularly, the present invention relates to the process of creating airgaps.

Field of Invention

With high integration of the semiconductor device, a distance between the conductive structures has decreased. For example, as the critical dimension shrink, when performing etching process to create airgaps, if the etching selectivity is not good, the process may lead to leakage or parasitic capacitance fail. Also, it would be a huge challenge to improve etching selectivity in a highly integrated semiconductor device.

Therefore, how to form a structurally complete air gap between elements to effectively reduce the parasitic capacitance of the device is an important development item for semiconductor devices.

SUMMARY

In accordance with an aspect of the present disclosure, a semiconductor device is provided. The semiconductor device includes a substrate and a bit line located on the substrate. A first spacer located on a sidewall of the bit line, wherein the first spacer includes a low-k material doped with carbon. A second spacer located on the substrate and adjacent to the first spacer, wherein the second spacer includes nitride. An air gap between the first spacer and the second spacer; wherein a bottom of the air gap exposes the substrate. A cover layer, covering the bit line, the first spacer, and the second spacer such that the air gap is sealed by the cover layer, the first spacer, and the second spacer.

According to some embodiments of the present disclosure, the semiconductor device includes a bit line spacer located on the sidewall of the bit line, wherein the bit line spacer is between the first spacer and the bit line.

According to some embodiments of the present disclosure, wherein the bit line spacer includes nitride.

According to some embodiments of the present disclosure, wherein the bit line spacer and the second spacer both include silicon nitride (SiN).

According to some embodiments of the present disclosure, wherein the first spacer includes silicon carbide (SiC).

According to some embodiments of the present disclosure, wherein a width of the air gap is in a range from about 3 nm to about 4 nm.

In accordance with an aspect of the present disclosure, a method of manufacturing a semiconductor device is provided. The method includes forming a bit line on a substrate. A first blanket layer is formed over a top surface and a sidewall of the bit line, wherein the first blanket layer includes low-k material doped with carbon. A portion of the first blanket layer on the top surface of the bit line is removed to form a first spacer on the sidewall of the bit line. An oxidation process is performed to the first spacer such that a surface portion of the first spacer is transformed to an oxide spacer, wherein the oxide spacer is oxidized by the oxidation process, and the first spacer has a remaining first spacer that is not oxidized by the oxidation process. A second blanket layer is formed over the bit line, the first spacer, and the oxide spacer, wherein the second blanket layer includes nitride. A portion of the second blanket layer on the top surface of the bit line is removed to form a second spacer on the oxide spacer. The oxide spacer is removed to form a gap between the remaining first spacer and the second spacer. A cover layer is formed to cover the bit line, the remaining first spacer, and the second spacer such that an air gap is sealed by the cover layer, the remaining first spacer, and the second spacer.

According to some embodiments of the present disclosure, wherein the first blanket layer includes silicon carbide (SiC).

According to some embodiments of the present disclosure, wherein after the oxidation process, the oxide spacer includes silicon oxycarbide (SiCO).

According to some embodiments of the present disclosure, wherein the oxide spacer is removed by a gas etching process.

According to some embodiments of the present disclosure, the method includes forming a bit line spacer on the sidewall of the bit line before forming the first blanket layer.

According to some embodiments of the present disclosure, wherein the bit line spacer, the second spacer, and the cover layer include silicon nitride (SiN).

According to some embodiments of the present disclosure, wherein the oxidation process is a plasma ashing process.

According to some embodiments of the present disclosure, wherein the oxidation process is performed with $O_2/(H_2+N_2)$ plasma.

According to some embodiments of the present disclosure, wherein an oxygen diffusion depth of the plasma ashing process in the first spacer is in a range from about 3 nm to about 4 nm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
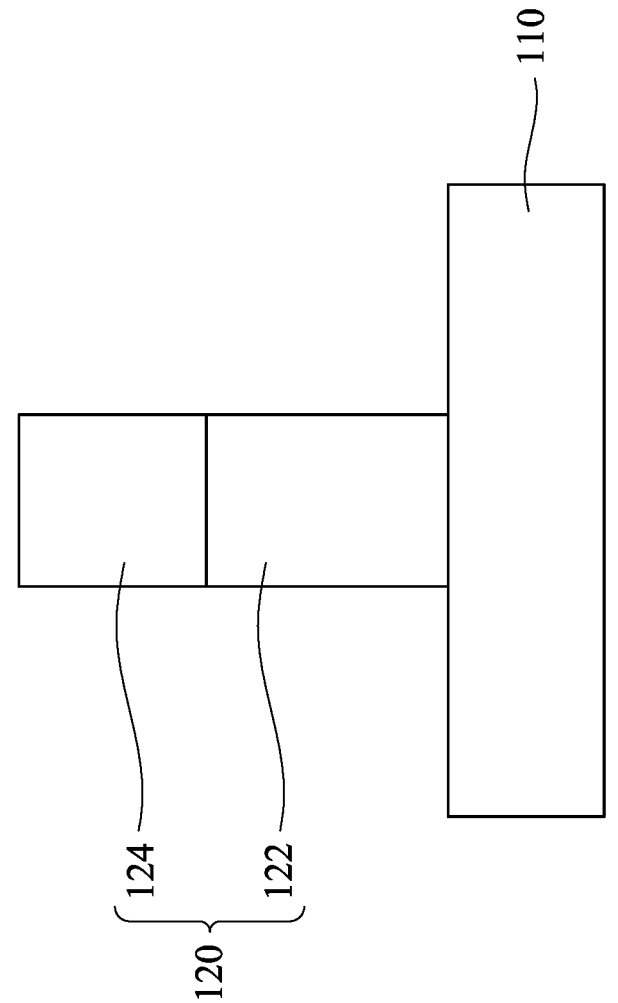
FIGS. 1-10 are cross-sectional views of various intermediate stages in the formation of a semiconductor device, in accordance with some embodiments.

Reference will now be made in detail to the present embodiments of the invention, examples of which are illustrated in the accompanying drawings. Wherever possible, the same reference numbers are used in the drawings and the description to refer to the same or like parts.

FIGS. 1-10 are cross-sectional views of various intermediate stages in the formation of a semiconductor device 100, in accordance with some embodiments. The semiconductor device 100 can be applied in an integrated circuit (IC) or a part thereof, such as a logic circuit, a resistor, a capacitor, an inductor, a memory (such as a dynamic random access memory (DRAM)), and the like. It should be understood that some elements of the semiconductor device 100 are not shown in FIGS. 1-10 to simplify the drawings, and that additional elements may be included in other embodiments of the semiconductor device 100.

Referring to FIG. 1, a bit line 120 is formed on a substrate 110. In some embodiments, the substrate 110 may be a semiconductor substrate, such as a bulk semiconductor substrate, a semiconductor-on-insulator (SOI) substrate, etc., wherein the insulator may be a buried oxide (BOX) layer, a silicon oxide layer, or the like. In some embodiments, the substrate 110 can be doped (eg, containing p-type or n-type dopants) or undoped. In some embodiments, the semiconductor material of the substrate 110 may include silicon, germanium, compound semiconductors (including silicon carbide, gallium arsenide, gallium phosphide, indium phosphide, indium arsenide, and/or indium antimonide), alloy semiconductors or a combination thereof. The substrate 110 can also be formed of other materials, such as sapphire, indium tin oxide, and the like. In some embodiments, the substrate 110 may include one or more active device (not shown) such as transistor.

As shown in FIG. 1, the bit line 120 may include a conductive layer 122 and a hard mask layer 124 stacked on the conductive layer 122. In some embodiments, the conductive layer 122 includes conductive material such as metal, metal alloy, metal nitride, or the like. In some examples, the conductive layer 122 may include tungsten. In some embodiments, the hard mask layer 124 may include silicon oxide, silicon nitride, other dielectric materials or combinations thereof. The bit line 120 may be formed by suitable deposition and patterning process.

Figure 2:
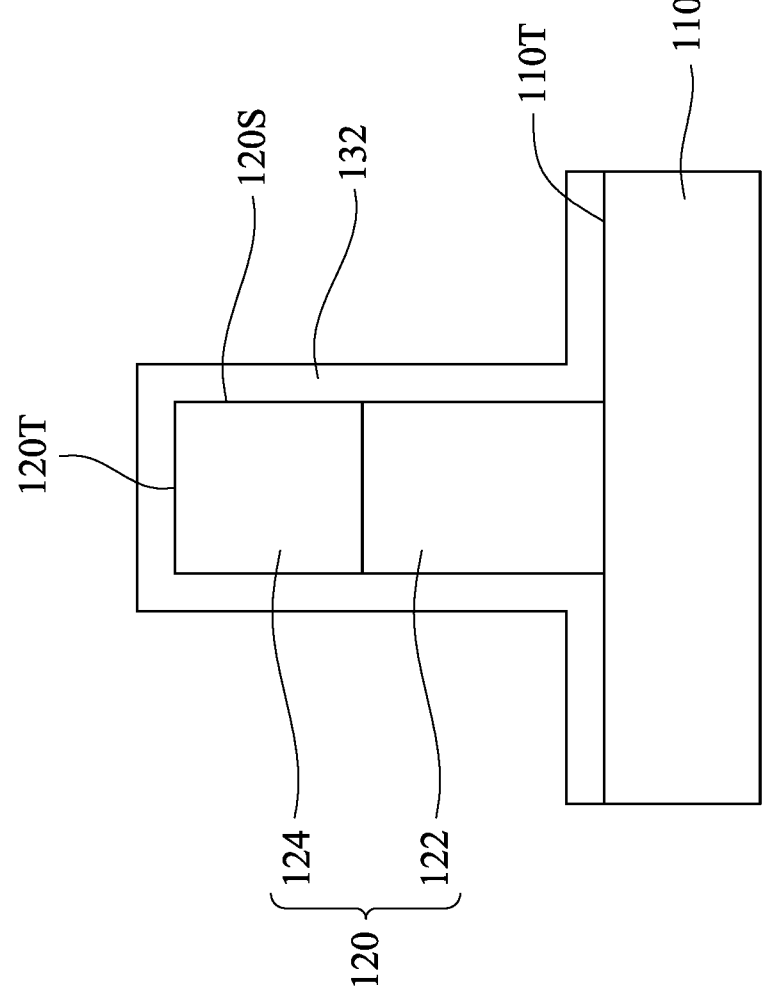

Referring to FIG. 2, a bit line blanket layer 130 is formed over a top surface 120T and sidewalls 120S of the bit line 120. A portion of the bit line blanket layer 130 may extend along a portion of the top surface 110T of the substrate 110. As shown in FIG. 2, the bit line blanket layer 130 is conformally formed on the bit line 120. In some embodiments, the bit line blanket layer 130 may include nitride. In some examples, the bit line blanket layer 130 may include silicon nitride. In some embodiments, the bit line blanket layer 130 may be formed using a suitable deposition process, such as chemical vapor deposition (CVD), plasma enhanced chemical vapor deposition (PECVD), atomic layer deposition (ALD), or the like.

Figure 3:
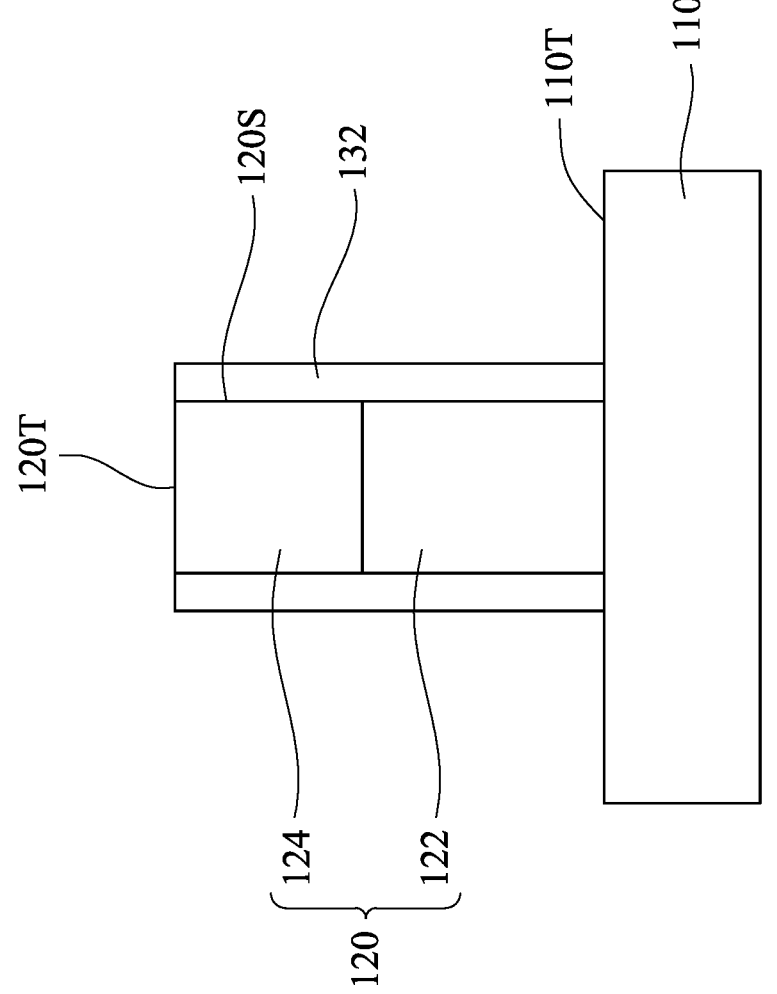

Referring to FIG. 3, the portion of the bit line blanket layer 130 on the top surface 120T of the bit line 120 and the portion of the bit line blanket layer 130 on the top surface 110T the substrate 110 is removed. In other words, the portions of the bit line blanket layer 130 that extend laterally are removed. After the removing process, a bit line spacer 132 is formed, and the top surface 120T of the bit line 120 is therefore exposed. As shown in FIG. 3, the bit line spacer 132 is formed on the sidewall 120S of the bit line 120. The portion of the bit line blanket layer 130 on the top surface 120T of the bit line 120 and the portion of the bit line blanket layer 130 on the top surface 110T the substrate 110 may be removed using a suitable directional dry etching process, such as plasma reactive etching, ion-beam etching, or the like.

Figure 4:
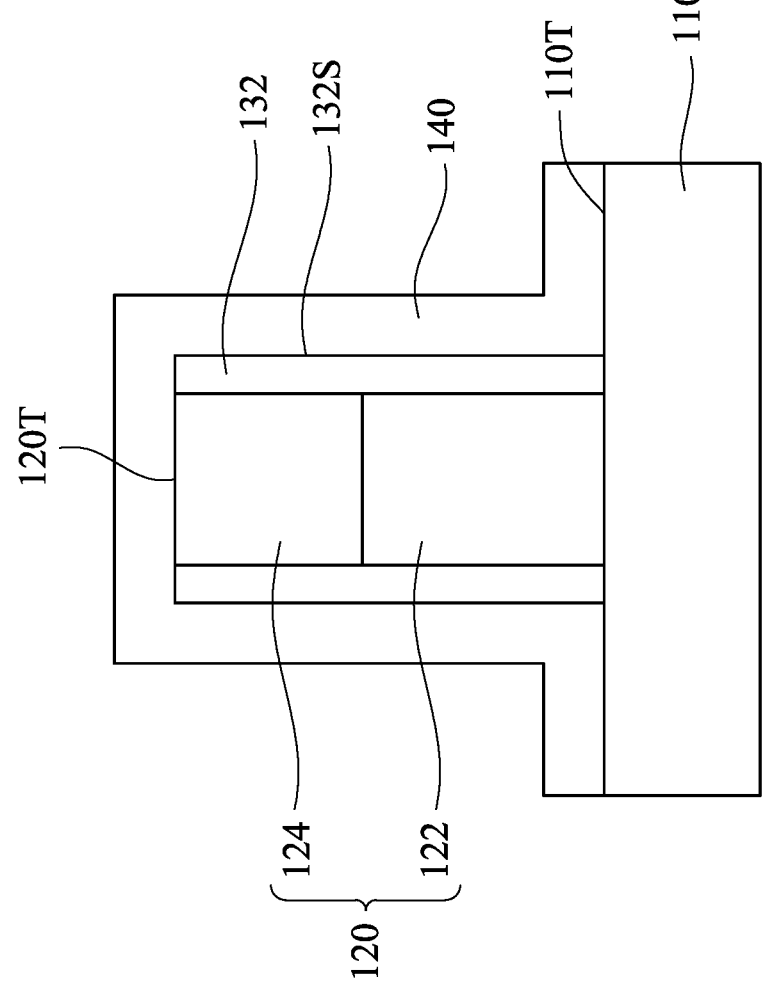

Referring to FIG. 4, a first blanket layer 140 is formed over a top surface 120T of the bit line 120 and the sidewalls 132S of the bit line spacer 132. A portion of the first blanket layer 140 may extend along a portion of the top surface 110T of the substrate 110. As shown in FIG. 4, the first blanket layer 140 is conformally formed over the bit line 120. In some embodiments, the first blanket layer 140 may include carbon. In some examples, the first blanket layer 140 may include silicon carbide. The first blanket layer 140 may also include other low-k dielectric materials or combinations thereof. In some embodiments, the first blanket layer 140 may be formed using a suitable deposition process, such as chemical vapor deposition (CVD), plasma enhanced chemical vapor deposition (PECVD), atomic layer deposition (ALD), or the like.

Figure 5:
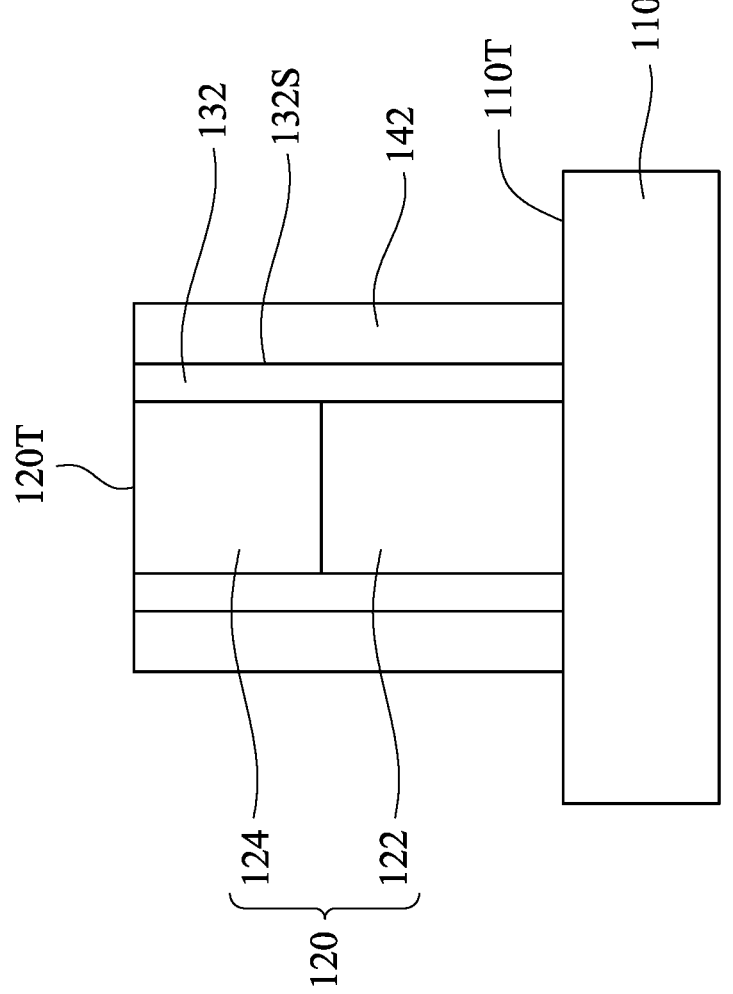

Referring to FIG. 5, the portion of the first blanket layer 140 on the top surface 120T of the bit line 120 and the portion of the first blanket layer 140 on the top surface 110T the substrate 110 are removed. In other words, the portions of the first blanket layer 140 that extend laterally are removed. After the removing process, a first spacer 142 is formed, and the top surface 120T of the bit line 120 is exposed. As shown in FIG. 5, the first spacer 142 is on the sidewall 132S of the bit line spacer 132. The portion of the first blanket layer 140 on the top surface 120T of the bit line 120 and the portion of the first blanket layer 140 on the top surface 110T the substrate 110 may be removed using a suitable directional dry etching process, such as plasma reactive etching, ion-beam etching, or the like.

Figure 6:
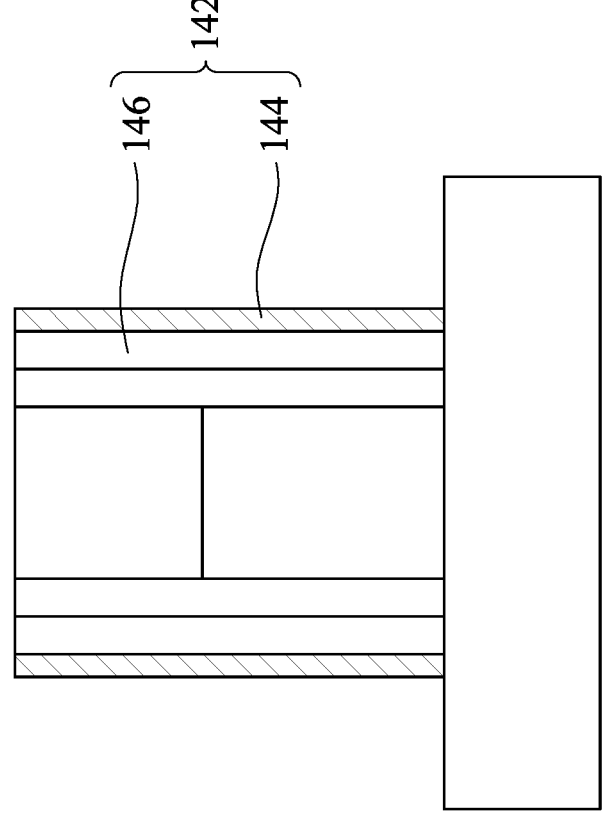

Referring to FIG. 6, an oxidation process is performed to oxidize a surface portion of the first spacer 142, such that an oxide spacer 144 is formed. The oxide spacer 144 is the portion that is oxidized by the oxidation process. In some embodiments the oxide spacer 144 includes low-k oxide material. In some examples, the oxide spacer 144 includes silicon oxycarbide (SiCO). In some examples, after the oxidation process, the surface of the first spacer 142 changed from SiC to SiCO. The remaining first spacer 146 is the portion of the first spacer 142 that is not oxidized by the above oxidation process. In some examples, the remaining first spacer 146 includes silicon carbide (SiC). The oxidation process includes a plasma ashing process, and the plasma ashing process is performed performed with $O_2/(H_2+N_2)$ plasma. In some embodiments, the plasma ashing process is performed for about 35 seconds. In some embodiments, oxygen diffusion depth by the plasma ashing process in the first spacer 142 has a predetermined depth, which is in a range from about 3 nm to about 4 nm. The structure of the oxide spacer 144 is relatively looser than the first spacer 142 and is easier to be removed in subsequent process.

Figure 7:
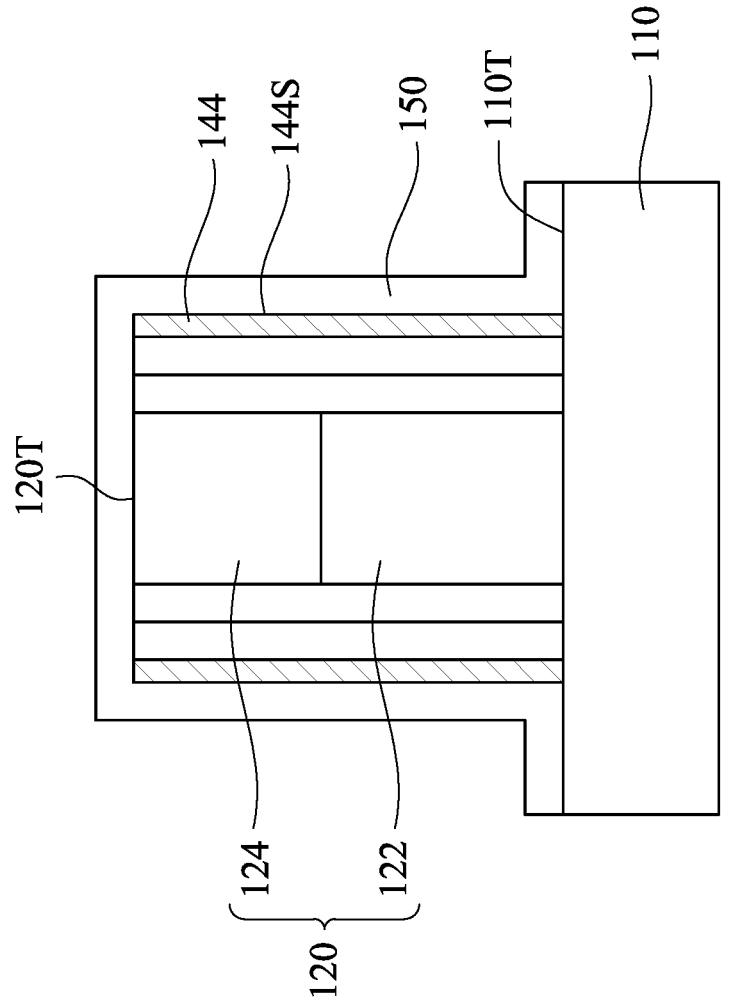

Referring to FIG. 7, a second blanket layer 150 is formed over a top surface 120T and sidewalls 144S of the oxide spacer 144. A portion of the second blanket layer 150 may extend along a portion of the top surface 110T of the substrate 110. As shown in FIG. 7, the second blanket layer 150 is conformally formed over the bit line 120. In some embodiments, the second blanket layer 150 may include nitride. In some examples, the second blanket layer 150 may include silicon nitride. In some embodiments, the second blanket layer 150 may be formed using a suitable deposition process, such as chemical vapor deposition, plasma enhanced chemical vapor deposition, atomic layer deposition, or the like.

Figure 8:
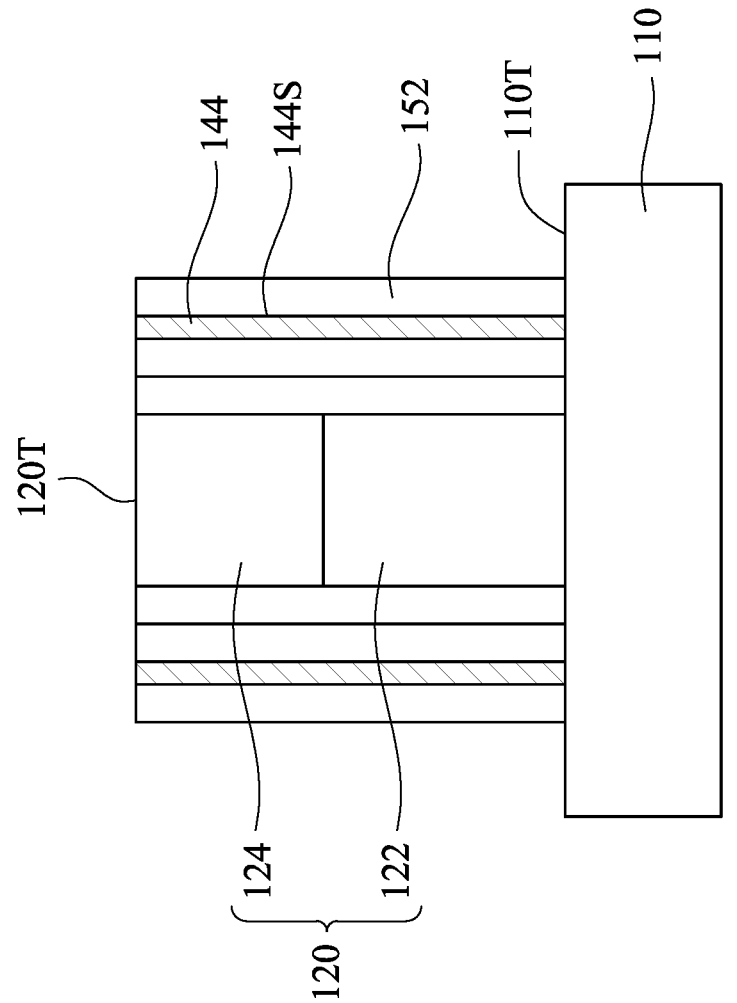

Referring to FIG. 8, the portion of the second blanket layer 150 on the top surface 120T of the bit line 120 and the portion of the second blanket layer 150 on the top surface 110T the substrate 110 is removed. In other words, the portions of the second blanket layer 150 that extend laterally are removed. After the removing process, a second spacer 152 is formed, and the top surface 120T of the bit line 120 is therefore exposed. As shown in FIG. 8, the second spacer 152 is formed on the sidewall 144S of the oxide spacer 144. The portion of the second blanket layer 150 on the top surface 120T of the bit line 120 and the portion of the second blanket layer 150 on the top surface 110T the substrate 110 may be removed using a suitable directional dry etching process, such as plasma reactive etching, ion-beam etching, or the like.

Figure 9:
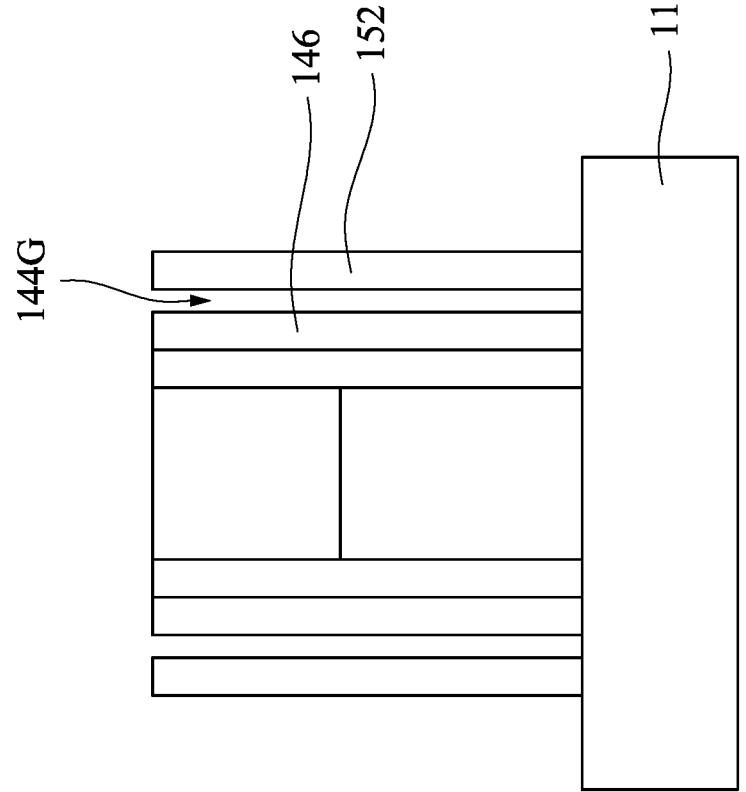

Referring to FIG. 9, the oxide spacer 144 is removed to form a gap 144G between the remaining first spacer 146 and the second spacer 152. Since the remaining first spacer 146 is a portion of the first spacer 142 that is not oxidized by the above oxidation process, the remaining first spacer 146 may be work as an etch stop layer. After the oxide spacer 144 is etched, the gap 144G exposes a portion of the substrate 110. The second spacer 152 is separated from the remaining first spacer 146 by the gap 144G. In some embodiments, the oxide spacer 144 may be removed using a suitable etching process, such as a gas etching process. The gas etching process may use any suitable gas etchant having a higher etching rate in the oxide spacer 144, and the gas etchant having a lower etching rate in the remaining first spacer 146 and the second spacer 152. In other words, the gas etchant may have a higher etching rate in SiCO, and have a lower etching rate in SiC and SiN.

Figure 10:
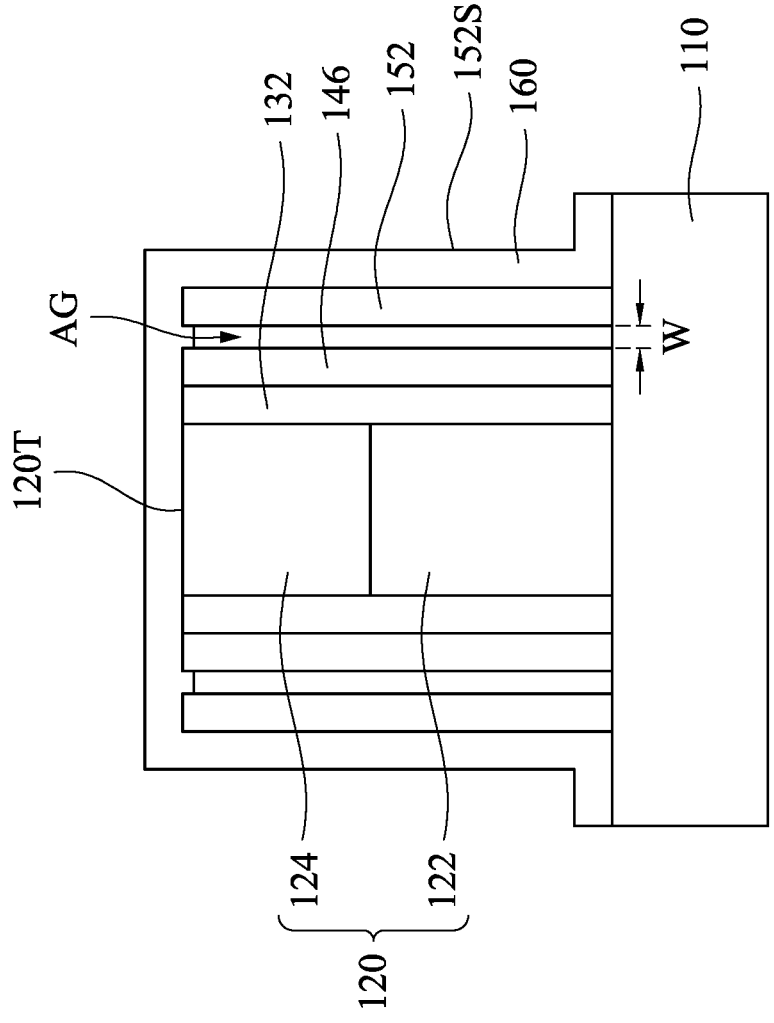

Referring to FIG. 10, a cover layer 160 is formed over the bit line 120. The cover layer is formed to cover the top surface 120T of the bit line 120, the top surface of the bit line spacer 130, the top surface of the remaining first spacer 146, the top surface of the second spacer and the sidewalls 152S of the second spacer 152. Specifically, the cover layer 160 may be conformally formed over the structure shown in FIG. 9 such that an air gap AG is formed between remaining first spacer 146 and the second spacer 152. The second spacer 152 is separated from the remaining first spacer 146 by the air gap AG. In some embodiments, the width W of the air gap AG is in a range from about 3 nm to about 4 nm.

In some embodiments, the material forming the cover layer 160 may include silicon nitride, silicon oxide, silicon oxynitride, metal, metal nitride or other suitable materials. In some embodiments, the cover layer 160 and the second spacer 152 may include the same material to increase the adhesion between the cover layer 160 and the second spacer 152. In some embodiments, the cover layer 160 may be formed using a suitable deposition process, such as chemical vapor deposition, plasma enhanced chemical vapor deposition, atomic layer deposition, or the like. In some embodiments, the air gap AG may not be filled with air, it may be filled with other types of gas, or it may be a vacuum.

The air gap AG can reduce the parasitic capacitance between the bit line 120 and the adjacent contact element (not shown), thereby increasing the reliability of the semiconductor device 100. After oxidation process the oxide spacer 144 is easier to be removed. The oxide spacer 144 of oxidized low-k material, and the adjacent remaining first spacer 146 and the second spacer 152 have high etching selectivity. In this way, the integrity of the air gap can be improved, and leakage and parasitic capacitance fail can be reduced.

Figure 11:
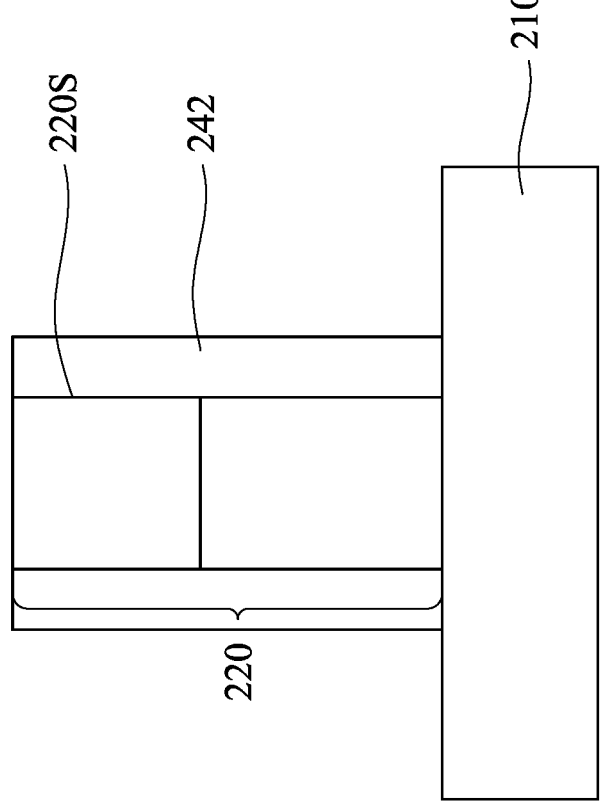
FIGS. 11-15 are cross-sectional views of various intermediate stages in the formation of a semiconductor device, in accordance with some other embodiments of this invention.

FIGS. 11-15 are cross-sectional views of various intermediate stages in the formation of a semiconductor device 200, in accordance with some other embodiments. Referring to FIG. 11, a bit line 220 is form on the substrate 210 of the semiconductor device 200, and a first spacer 242 is formed on the sidewall of the bit line 220. The substrate 210 and the bit line 210 are similar to the substrate 110 and the bit line 110 respectively. In some embodiments, the first spacer 242 may include carbon. In some examples, the first spacer 242 may include silicon carbide. The first spacer 242 may also include other low-k dielectric materials or combinations thereof.

Figure 12:
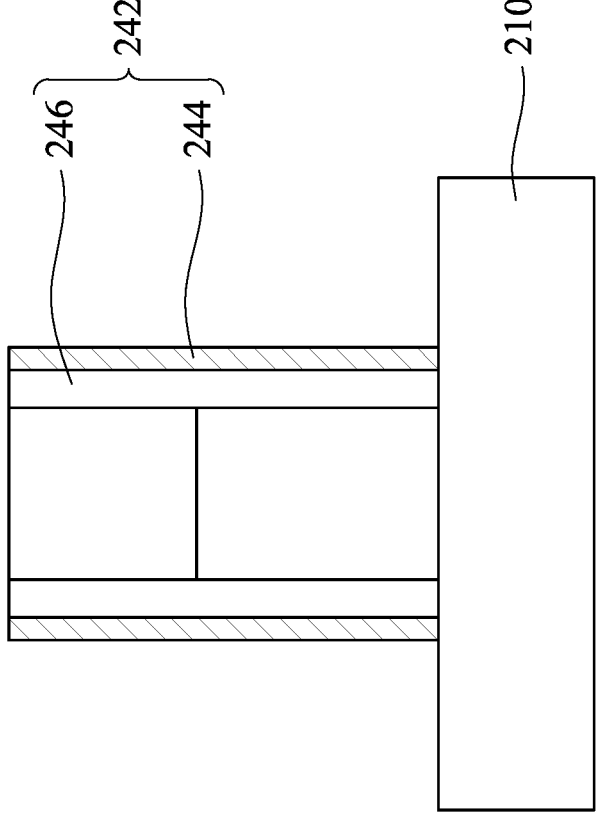

Referring to FIG. 12, an oxidation process is performed to oxidize a surface portion of the first spacer 242, such that an oxide spacer 244 is formed. The oxide spacer 244 is the portion that is oxidized by the oxidation process. In some examples, the silicon oxycarbide. The remaining first spacer 246 is the portion of the first spacer 242 that is not oxidized by the above oxidation process. In some examples, the remaining first spacer 246 includes silicon carbide. The oxide spacer 244 can be formed using above-mentioned process details. The structure of the oxide spacer 244 is relatively looser than the first spacer 242 and is easier to be removed in subsequent process. In other words, the oxide spacer 244 has an etching selectively higher than the first spacer 242.

Figure 13:
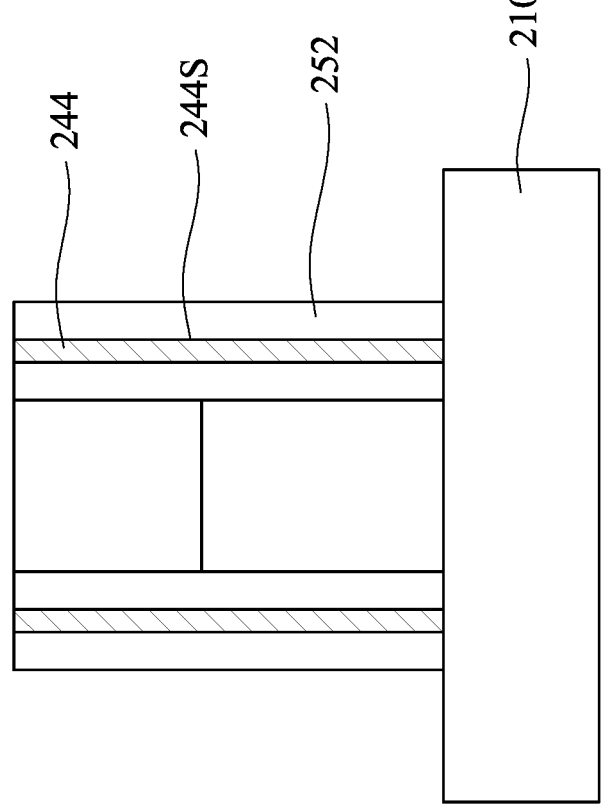

Referring to FIG. 13, a second spacer 252 is formed on the sidewall 244S of the oxide spacer 244. The second spacer 252 can be formed using above-mentioned process details. In some embodiments, the second spacer 252 may include nitride. In some examples, the second spacer 252 may include silicon nitride.

Figure 14:
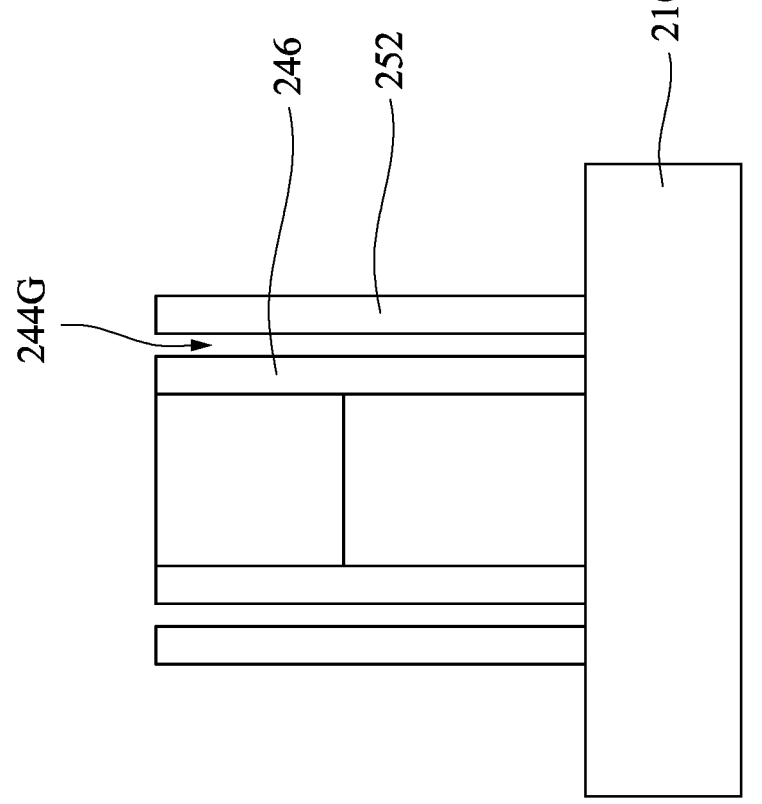

Referring to FIG. 14, the oxide spacer 244 is removed to form a gap 244G between the remaining first spacer 246 and the second spacer 152. Since the remaining first spacer 146 is a portion of the first spacer 142 that is not oxidized by the above oxidation process, the remaining first spacer 146 may be work as an etch stop layer. The second spacer 152 is separated from the remaining first spacer 146 by the gap 144G. The oxide spacer 244 can be removed using above-mentioned process details.

Figure 15:
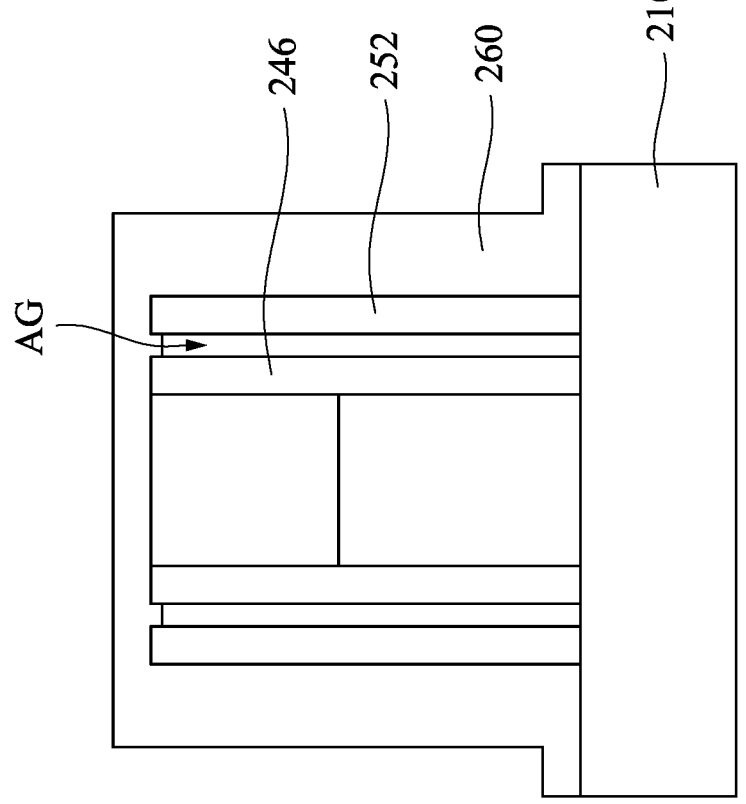

Referring to FIG. 15, a cover layer 260 is formed over the bit line 220, such that an air gap AG is formed between remaining first spacer 246 and the second spacer 252. The second spacer 252 is separated from the remaining first spacer 246 by the air gap AG. In some embodiments, the width W of the air gap AG is in a range from about 3 nm to about 4 nm. In this example, when the above-mentioned bit line spacer 132 is replaced by the first spacer 242, the overall k value of the remaining first spacer 246 and the second spacer 252 is lower than the overall k value of bit line spacer 132, remaining first spacer 146, and the second spacer 152. When the above-mentioned bit line spacer 132 is omitted, the remaining first spacer 246 that is not oxidized can provide a better effect as an etching stop layer.

According to the above embodiments of the present disclosure, the present disclosure provides a semiconductor device and a method of manufacturing thereof. With the method provided in this disclosure, the spacer made of the low-k material is oxidized and removed to form an air gap. The oxidized low-k material forms a relatively loose structure, and the oxidation diffusion depth of the low-k material has a predetermined depth. After oxidation process, the oxidized low-k material is easier to be removed. The low-k material and the adjacent spacer have a high etching selectivity. In this way, the integrity of the air gap can be improved, and leakage and parasitic capacitance fail can be reduced. The air gap can effectively reduce the parasitic capacitance between the bit line and adjacent contact element, thereby increasing the stability of the semiconductor device.

As used herein, the terms "about" and "approximately" generally mean plus or minus 10% of the stated value. For example, about 0.5 would include 0.45 and 0.55, about 10 would include 9 to 11, about 1000 would include 900 to 1100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
a substrate;
a bit line located on the substrate;
a first spacer located on a sidewall of the bit line, wherein the first spacer comprises a carbon-doped low-k material;
a second spacer located on the substrate and adjacent to the first spacer, wherein the second spacer comprises nitride;
an air gap between the first spacer and the second spacer; wherein a bottom of the air gap exposes the substrate;
a cover layer, covering the bit line, the first spacer, and the second spacer such that the air gap is sealed by the cover layer, the first spacer, and the second spacer; and
a bit line spacer located on the sidewall of the bit line, wherein the bit line spacer is between the first spacer and the bit line.

2. The semiconductor device of claim 1, wherein the bit line spacer comprises nitride.

3. The semiconductor device of claim 1, wherein the bit line spacer and the second spacer both comprise silicon nitride (SiN).

4. The semiconductor device of claim 1, wherein the first spacer comprises silicon carbide (SiC).

5. The semiconductor device of claim 1, wherein a width of the air gap is in a range from about 3 nm to about 4 nm.

6. A method of manufacturing a semiconductor device, comprising:
forming a bit line on a substrate;
forming a first blanket layer over a top surface and a sidewall of the bit line, wherein the first blanket layer comprises low-k material doped with carbon;

removing a portion of the first blanket layer on the top surface of the bit line to form a first spacer on the sidewall of the bit line;
performing an oxidation process to the first spacer such that a surface portion of the first spacer is transformed to an oxide spacer, wherein the oxide spacer is oxidized by the oxidation process, and the first spacer has a remaining first spacer that is not oxidized by the oxidation process;
forming a second blanket layer over the bit line, the first spacer, and the oxide spacer, wherein the second blanket layer comprises nitride;
removing a portion of the second blanket layer on the top surface of the bit line to form a second spacer on the oxide spacer;
removing the oxide spacer to form a gap between the remaining first spacer and the second spacer; and
forming a cover layer to cover the bit line, the remaining first spacer, and the second spacer such that an air gap is sealed by the cover layer, the remaining first spacer, and the second spacer.

7. The method of claim 6, wherein the first blanket layer comprises silicon carbide (SiC).

8. The method of claim 6, wherein after the oxidation process, the oxide spacer comprises silicon oxycarbide (SiCO).

9. The method of claim 6, wherein the oxide spacer is removed by a gas etching process.

10. The method of claim 6, further comprising:
forming a bit line spacer on the sidewall of the bit line before forming the first blanket layer.

11. The method of claim 10, wherein the bit line spacer, the second spacer, and the cover layer comprise silicon nitride (SiN).

12. The method of claim 6, wherein the oxidation process is a plasma ashing process.

13. The method of claim 12, wherein the oxidation process is performed with $O_2/(H_2+N_2)$ plasma.

14. The method of claim 12, wherein an oxygen diffusion depth of the plasma ashing process in the first spacer is in a range from about 3 nm to about 4 nm.

* * * * *